United States Patent [19]

Wu

[11] Patent Number: 6,117,731
[45] Date of Patent: Sep. 12, 2000

[54] METHOD OF FORMING HIGH CAPACITIVE-COUPLING RATIO AND HIGH SPEED FLASH MEMORIES WITH A TEXTURED TUNNEL OXIDE

[75] Inventor: Shye-Lin Wu, Hsinchu, Taiwan

[73] Assignee: Texas Instruments-Acer Incorporated, Hsinchu, Taiwan

[21] Appl. No.: 09/270,908

[22] Filed: Mar. 15, 1999

Related U.S. Application Data

[63] Continuation-in-part of application No. 09/036,027, Mar. 6, 1998, Pat. No. 5,970,342.

[51] Int. Cl.$^7$ .................................................. H01L 21/336
[52] U.S. Cl. ............................ 438/260; 438/264; 438/257
[58] Field of Search ...................................... 438/398, 255, 438/254, 257, 260, 264, 265, 211, 964; 257/317

[56] References Cited

U.S. PATENT DOCUMENTS

| | | | |
|---|---|---|---|
| 5,384,152 | 1/1995 | Chu et al. ................................... | 427/81 |
| 5,459,088 | 10/1995 | Rha et al. ................................... | 437/40 |
| 5,767,005 | 6/1998 | Doan et al. ............................... | 438/593 |
| 5,858,853 | 1/1999 | Shishiguchi et al. .................... | 438/398 |
| 5,872,033 | 2/1999 | Figura ....................................... | 438/255 |
| 5,930,625 | 7/1999 | Lin et al. .................................. | 438/253 |
| 5,970,342 | 10/1999 | Wu ............................................ | 438/260 |
| 5,970,360 | 10/1999 | Cheng et al. ............................. | 438/398 |
| 5,981,334 | 11/1999 | Chien et al. .............................. | 438/253 |
| 6,040,629 | 3/2000 | Shimizu et al. .......................... | 257/770 |

*Primary Examiner*—Matthew Smith
*Assistant Examiner*—Lex H. Malsawma
*Attorney, Agent, or Firm*—Harness, Dickey & Pierce, P.L.C.

[57] ABSTRACT

The method of the present invention includes patterning a gate structure. Then, a polyoxide layer is formed on side walls of the gate structure. Then, silicon nitride side wall spacers are formed on the side walls of the gate structure. Then, source/drain structure of the device is fabricated. Next, the side wall spacers are removed to expose a portion of the source and drain. Then, an undoped amorphous silicon layer is formed on the surface of the gate structure, the oxide layer and the exposed source and drain. A dry oxidation process is used to convert the amorphous silicon layer into textured tunnel oxide at the interface of the substrate and the oxide. The oxide is then removed, and a further oxide is re-deposited on the gate and substrate. Polysilicon side wall spacers are then formed. A further polysilicon layer is subsequently deposited over the gate. Then, the polysilicon layer is patterned to define the floating gate. A dielectric is formed at the top of the floating gate. A conductive layer is formed on the dielectric layer as the control gate.

19 Claims, 4 Drawing Sheets

METHOD OF FORMING HIGH CAPACITIVE-COUPLING RATIO AND HIGH SPEED FLASH MEMORIES WITH A TEXTURED TUNNEL OXIDE

This is a continuation in part application of Ser. No. 09/036,027 filed Mar. 6, 1998, entitled "METHOD OF FORMING HIGH CAPACITIVE-COUPLING RATIO AND HIGH SPEED FLASH MEMORIES WITH A TEXTURED TUNNEL OXIDE" now U.S. Pat. No. 5,970,342.

FIELD OF INVENTION

The present invention relates to a semiconductor device, and more specifically, to a method of fabricating flash memories.

BACKGROUND OF THE INVENTION

Flash memory is one of the segments of nonvolatile memory devices. The device includes a floating gate to storage charges and an element for electrically placing charge on and removing the charges from the floating gate. One of the applications of flash memory is BIOS for computer. Typically, the high-density nonvolatile memories can be applied as the mass storage of portable handy terminals, a solid state camera and PC cards. That is because the nonvolatile memories exhibit many advantages, such as fast access time, low power dissipation, and robustness.

Mitchellx has proposed EPROMs with self-aligned planar array cell. In this technique, buried diffusion self-aligned to the floating gate avalanche injection MOS transistor are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553, (1987).

Bergemont proposed another cell array for portable computing and telecommunications application, which can be seen in Bergmont et al., "Low Voltage NVG™: A New High Performance 3 V/5 V Flash Technology for Portable Computing and Telecommunications Applications", IEEE Trans. Electron Devices, vol. ED-43, p. 1510, (1996). This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the fileld of integrated circuits. In the article, the access time is one of the key concerns for low voltage read operation. The NVG array uses select devices to achieve a fast access time by reducing the pre-charge time to that of a single segment rather than the full bit-line.

The formation of nonvolatile memories leans toward the trends of low supply power and fast access, because these requirements are necessary for the application of the mobile computing system. One important key parameter of high performance memory is capacitive-coupling ratio. Earlier disclosures propose a structure to increase the capacitive-coupling ratio by using hemispherical grained (HSG) silicon to increase the surface area of floating gate. Buried $n^+$ diffusion layers are formed with self-aligned arsenic ion implantation and the cell structure works at 3V. Please see Shirai, et al., "A 0.54 $\mu m^2$ Self-Aligned, HSG Floating Gate Cell for 256 Mbit Flash Memories", IEDM Tech. Dig., p.653, (1995).

Flash memory needs the charges to be held in the floating gate for long periods of time. Therefore, the dielectric that is used for insulating the floating gate needs to capable of high performance. At present, the low voltage flash memory is applied with a voltage of about 3V or 5V during charging or discharging of the floating gate. As is known in the art, tunneling is a basic technology in charging or discharging. In order to attain high tunneling efficiency, the thickness of the dielectric between the floating gate and substrate have to be scaled down due to the reduction of supply voltage. However, this will degrade the reliability of the dielectric when the thickness of the dielectric is scaled down below 10 nm. Reference may be had to "Flash Technology: Challenge and Opportunities", Raghupathy V. Giridhar, Jap. J. Appl. Phys. Vol. 35 pp. 6347–6350 (1996) and K. Yoshikawa et al., "Comparison of Current Flash EEPROM Erasing Methods: Stability and How to Control", IEDM, Tech. Dig., p595, (1992)00.

SUMMARY OF THE INVENTION

The method of the present invention includes forming a gate oxide layer on a substrate. Subsequently, a doped polysilicon layer is deposited on the gate oxide layer. Then, a silicon nitride layer is deposited on the polysilicon layer to improve the resolution of lithography. An etching step is used to etch the silicon nitride layer, polysilicon layer and gate oxide for forming a the gate structure. A dielectric layer is formed on the substrate. Then, a polyoxide layer is simultaneously formed on the side walls of the gate structure in the procedure.

Then, a silicon nitride layer is formed on the surface of the substrate. Successively, the dielectric layer is etched back to form side wall spacers on the side walls of the gate structure. Thus, only the portions of the oxide under the side wall spacers are left. The source/drain structure of the device is fabricated using conventional masking and ion implantation steps. A high temperature oxidation is performed to drive dopants deeper into the substrate.

The next step is to remove the side wall spacers and the oxide layer to expose a portion of the source and drain. The silicon nitride layer and polyoxide layer are also stripped, thereby exposing the gate structure. Then, an undoped amorphous silicon layer is formed on the surface of the gate structure, the oxide layer and the exposed source and drain. A dry oxidation process is used to convert the amorphous silicon layer into a textured tunnel oxide at the interface of the substrate and the oxide. Then, the oxide is removed, followed by re-depositing a further oxide layer on the surface of the gate and substrate. A deposition and a further etching are used to form polysilicon side wall spacers. The oxide at the top of the gate is removed during the formation of the side wall spacers. Another polysilicon layer is subsequently deposited over the gate. Then, the polysilicon layer is patterned to define the floating gate. An inter polysilicon dielectric is formed at the top of the floating gate. A conductive layer is formed on the dielectric layer as the control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
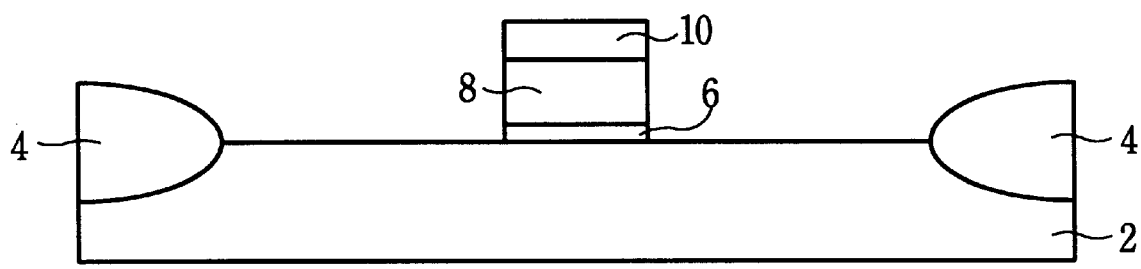
FIG. 1 is a cross-sectional view of a semiconductor wafer illustrating the steps of forming a gate structure on a semiconductor substrate according to the present invention.

The present invention proposes a novel method to fabricate a flash nonvolatile memory. In the method, undoped hemispherical grained silicon (HSG-Si) or amorphous silicon will be used to form a textured tunneling oxide to enhance the tunneling efficiency. The structure can increase the capacitive-coupling ratio. The textured structure is constructed by the rapid diffusion of oxygen through the grain boundaries of the silicon film into silicon substrate. Further, silicon nitride formed by jet vapor system is also introduced in the application as a gate dielectric. The nitride is referred to as JVD nitride. An oxide removal step and a re-deposition step are undertaken to achieve a rugged surface of the polysilicon gate, thereby increasing the surface area of the gate. The detailed description will be seen as follows.

A semiconductor substrate is provided for the present invention. In a preferred embodiment, as shown in the FIG. 1, a single crystal silicon substrate 2 with a <100> crystallographic orientation is provided. A plurality of isolations 4 between devices are formed on the substrate 2. In general, field oxide (FOX) isolation or trench isolation techniques can be introduced to serve as the isolations 4. For example, the FOX regions 4 can be formed via lithography and etching steps to etch a silicon nitride/silicon dioxide composition layer. After the photoresist is removed and wet cleaned, thermal oxidation in a steam environment is used to grow the FOX regions 4.

A thin gate oxide layer 6 consisting of silicon oxide is formed on the substrate 2. Typically, the gate oxide 6 can be grown in oxygen ambient at a temperature of about 700 to 1100 degrees centigrade. Other methods, such as chemical vapor deposition, can also be used to form the gate oxide 6. In the embodiment, the thickness of the silicon dioxide layer 6 is approximately 15–250 angstroms. In addition, ultra thin silicon nitride formed by jet vapor deposition (JVD) can be selected as the gate dielectric. The JVD nitride exhibit excellent electrical properties. Compared to thermal oxide, the JVD nitride include lower leakage current and higher resistance to boron penetration. The JVD nitride can be deposited at room temperature using JVD technique, followed by annealing at about 800 to 850 centigrade degrees. Subsequently, a doped polysilicon layer 8 is deposited on the gate oxide layer 6. Generally, the polysilicon layer 8 is chosen from doped polysilicon or in-situ polysilicon. For an embodiment, the doped polysilicon layer 8 is doped by phosphorus using a $PH_3$ source. Then, a silicon nitride layer ($SiN_x$) 10 is deposited on the polysilicon layer 8 for acting as an anti-reflective coating (ARC) layer to improve the resolution of lithography. Any suitable process can be used to form the silicon nitride layer 10. As known by a person of ordinary skills in the art, the silicon nitride layer 10 can be formed using Low Pressure Chemical Vapor Deposition (LPCVD), Plasma Enhance Chemical Vapor Deposition (PECVD), and so on. Further, the temperature forming the silicon nitride layer 8 is at a range of 300–800 degrees centigrade. In the preferred embodiment, the reaction gases of the step to form silicon nitride layer 10 are $SiH_4$, $NH_3$, $N_2$, $N_2O$ or $SiH_2Cl_2$, $NH_3$, $N_2$, $N_2O$.

Next, and still referring to FIG. 1, standard lithography and etching steps are used to etch the silicon nitride layer 10, polysilicon layer 8 and gate oxide 6 to the surface of the substrate 2 for forming a gate structure.

Figure 2:
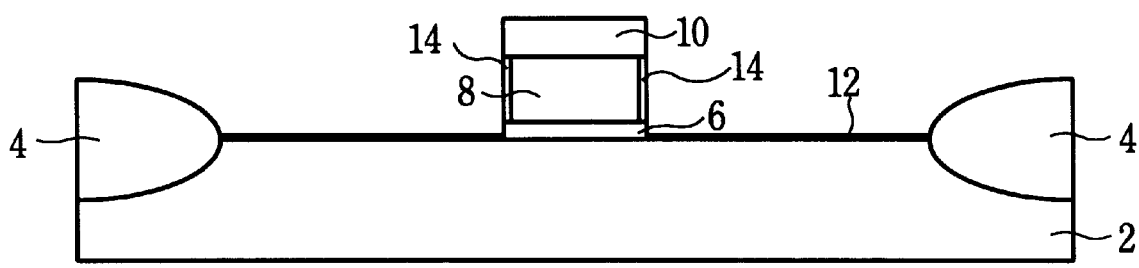
FIG. 2 is a cross-sectional view of a semiconductor wafer illustrating the step of forming polyoxide according to the present invention.

Turning to FIG. 2, subsequently, an ultra thin dielectric layer, such as silicon oxynitride layer 12, is formed on the substrate 2 where it is exposed by the gate structure. In this case, the silicon oxide layer 12 is formed by thermal oxidation in $N_2O$ or NO environment. This can also be done in $N_2$ and $O_2$ ambient. The temperature for forming the silicon oxide layer 12 ranges from 700 to 1150 degrees centigrade. The thickness is preferably about 25 to 150 angstroms. Further, a polyoxide layer 14 is simultaneously formed on side walls of the gate structure in the procedure.

Figure 3:
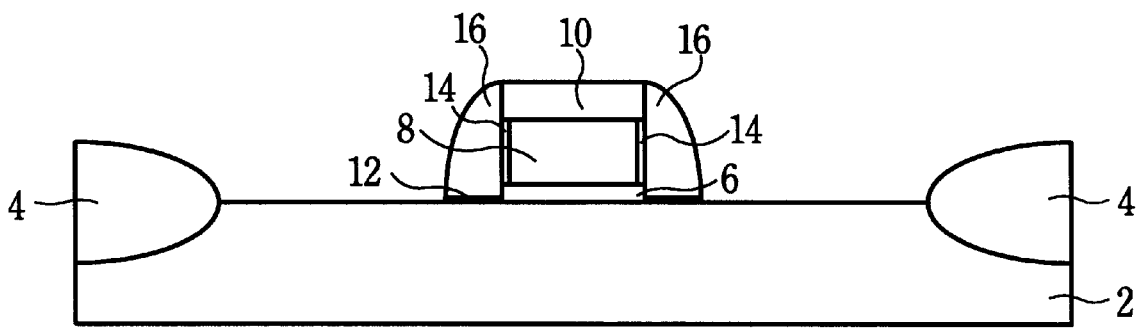
FIG. 3 is a cross-sectional view of a semiconductor wafer illustrating the step of forming silicon nitride side wall spacers according to the present invention.

Then, side wall spacers 16 are formed on the side walls of the gate structure for isolating, as shown in FIG. 3. In order to achieve this, a dielectric layer, such as silicon nitride layer, is formed on the surface of the substrate 2 and along a surface of the gate structure. Successively, the dielectric layer is anisotropically etched by using an anisotropical etching process to construct the side wall spacers 16. In this case, the dielectric layer can be formed of silicon nitride layer, which is formed by using the aforesaid method. Thus, only the portions of the oxide 12 under the side wall spacers 16 are left and adjacent to the gate oxide 6.

Figure 4:
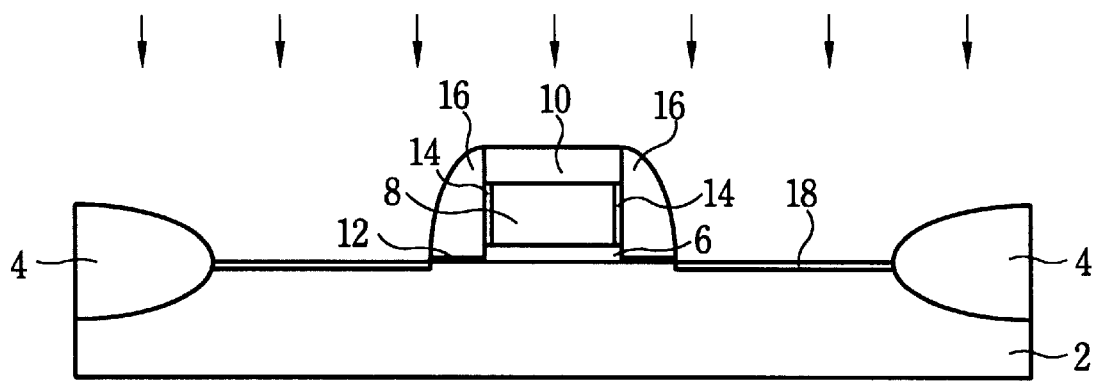
FIG. 4 is a cross-sectional view of a semiconductor wafer illustrating the step of forming source and drain according to the present invention.

The source/drain structure of the device may now be fabricated using conventional masking and ion implantation steps. Please turn to FIG. 4. An ion implantation is carried out to dope dopants into the substrate 2 by using the gate structure and side wall spacers 16 as a mask. In this step, a buried conductive diffusion layer 18 is formed in the substrate 2 adjacent to the gate structure to serve as source and drain. For example, n type conductive dopants may be used for the implantation. The source and drain 18 are formed by a conventional ion implantation with n conductive type dopants such as phosphorus or arsenic at a dose about 2E15 to 5E16 atoms/$cm^2$, and an energy is about 0.5 to 120 KeV. It should be well understood by those skill in the art that a p type conductive dopants could be used by simply substituting opposite dopants to those given for the aforesaid step.

Figure 5:
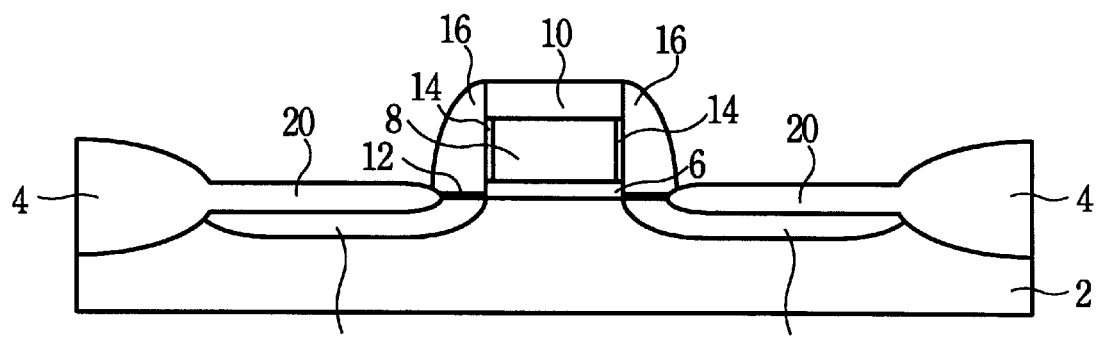
FIG. 5 is a cross-sectional view of a semiconductor wafer illustrating the step of performing a thermal process to drive the dopants into the substrate according to the present invention.

Turning to FIG. 5, a high temperature oxidation is performed to drive dopants deeper into the substrate 2. At the same time, an oxide layer 20 having a thickness about 500 to 2000 angstroms is grown on the top of the source and drain 18 that are exposed by the gate structure and the isolating spacers 16.

Figure 6:
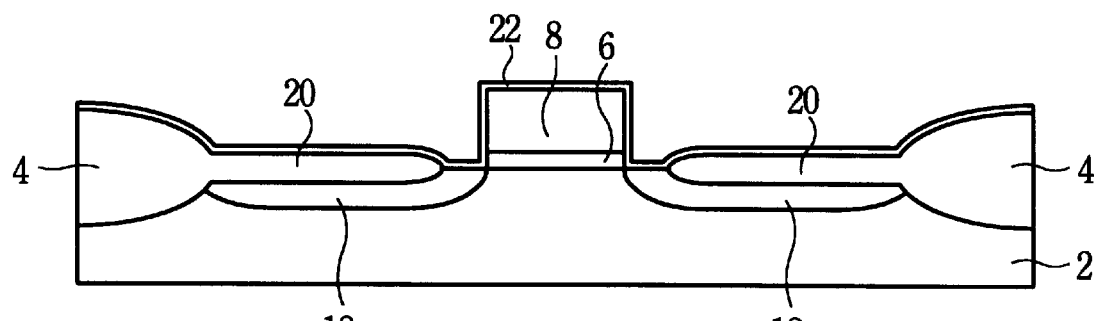
FIG. 6 is a cross-sectional view of a semiconductor wafer illustrating the steps of forming an amorphous silicon layer according to the present invention.

Turning to FIG. 6, the following step is to remove the side wall spacers 16 and the silicon nitride layer 10. The oxide layer 12 that is uncovered by the gate and the polyoxide layer 14 are then stripped, thereby exposing the gate structure and expose a portion of the source and drain 18. In the embodiment, the silicon nitride can be removed by using hot phosphorus acid solution. Using HF solution or BOE (buffer oxide etching) solution can strip the oxide layer.

Then, an undoped thin amorphous silicon layer or hemispherical grained silicon (HSG-Si) 22 is formed on the surface of the gate structure, the oxide layer 20 and the exposed source and drain 18. The thickness of the undoped amorphous silicon layer or hemispherical grained silicon (HSG-Si) 22 is about 20 to 200 angstroms. The amorphous silicon 22 is formed in a furnace at about 400 to 600 degrees centigrade in an ambient containing $SiH_4/N_2$.

Figure 7:
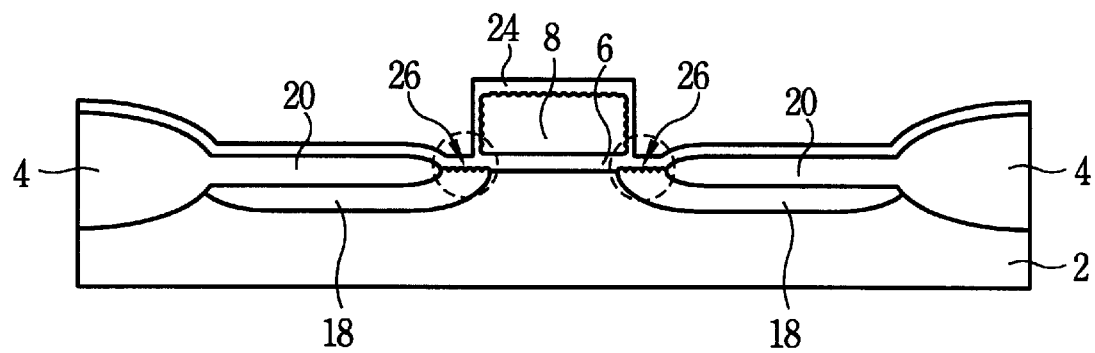
FIG. 7 is a cross-sectional view of a semiconductor wafer illustrating the step of forming a textured tunneling oxide according to the present invention.
Figure 8:
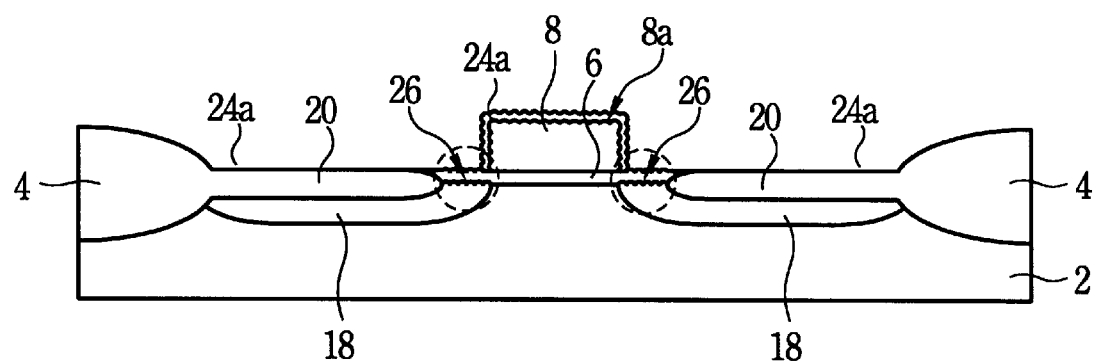
FIG. 8 is a cross-sectional view of a semiconductor wafer illustrating the steps of removing the oxide and forming a further oxide according to the present invention.

Turning to FIG. 7, a dry oxidation process is introduced at 700 to 1000 degrees centigrade in $O_2$ ambient to convert the amorphous silicon layer (or HSG-Si) 22 into oxide 24 with textured profile 26 at the interface of the substrate 2 and the oxide 24. This structure is referred to as TOPS (thermally oxidizing a polysilicon film on silicon substrate). The mechanism of forming the textured structure is the rapid diffusion of oxygen through the grain boundaries of the silicon film into silicon substrate 2 and the enhanced oxidation rate at the grain boundaries. Therefore, a textured silicon/oxide interface is achieved. Turning to FIG. 8, the oxide layer 24 is then removed. The HSG-Si or the amorphous silicon can be oxidized completely, thus the removal step of the oxide 24 can be controlled by using HF solution or BOE solution. The resulting structure of the polysilicon gate 8 has a rugged surface 8a after the oxide layer 24 is removed due to the grain boundaries having fast oxidation rate. Another oxide layer 24a is re-deposited on the rugged surface 8a of the gate 8 and on the substrate surface. The oxide can be formed by using conventional chemical vapor deposition using TEOS as reaction source. Preferably, the oxide layer 24a is formed by thermal oxidation, the gate dimension will be reduced due to the oxidation. The rugged surface 8a of the gate increases the surface area of the gate 8. The present invention has a high capacitive-coupling ratio due to the extended area of the floating gate, therefor it can be used for low power operation.

The textured interface 26 results in localized high fields and enhances the electron injection into TOPS. The tunneling oxide 24 having textured interface 26 has a higher electron conduction efficiency and lower electron trapping rate. This can refer to an article proposed by S. L. Wu, "Characterization of Thin Textured Tunnel Oxide Prepared by Thermal Oxidation of Thin Polysilicon Film on Silicon", IEEE, Trans. Electron Devices, vol. ED-43, pp. 287–294, (1996).

The present invention exhibits high speed and low power operation due to the high electron injection efficiency of textured tunnel oxide. The read or write speed is higher than the conventional structure in read, write modes.

Figure 9:
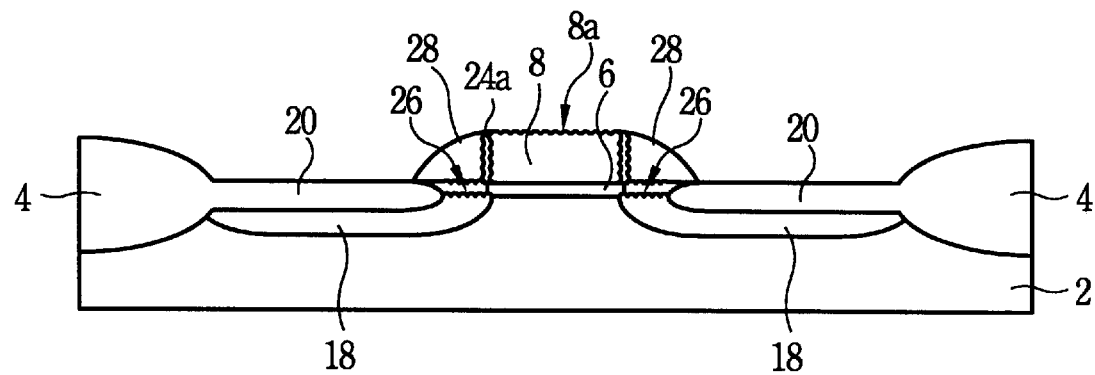
FIG. 9 is a cross-sectional view of a semiconductor wafer illustrating the step of forming polysilicon side wall spacers according to the present invention.
Figure 10:
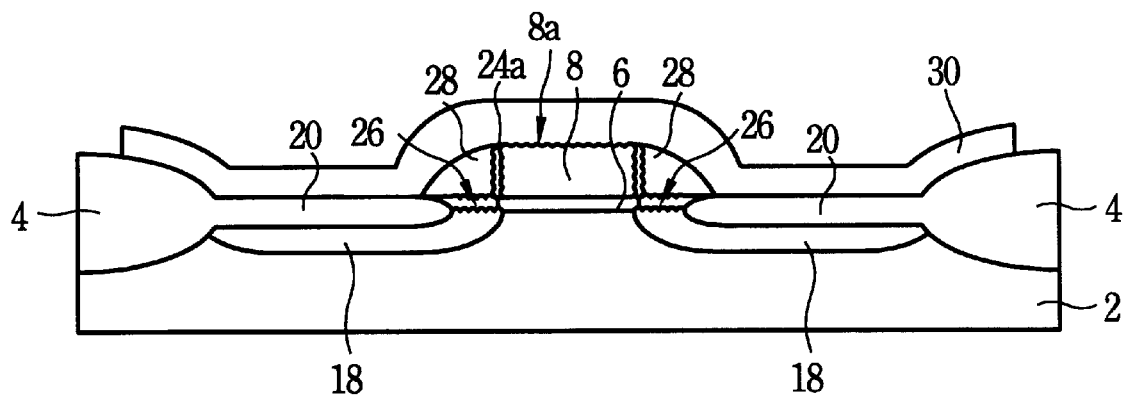
FIG. 10 is a cross-sectional view of a semiconductor wafer illustrating the step of forming a floating gate according to the present invention.

As shown in FIG. 9, polysilicon side wall spacers 28 having n+ type conductive dopants are formed on the side walls of the gate 8. As is known in the art, a deposition and a further etching can achieve this structure. The oxide 24a at the top of the gate 8 is removed during the formation of the side wall spacers 28. Accordingly, the oxide 24a on the oxide 20 is also stripped as shown in the scheme. Another polysilicon layer 30 is subsequently deposited over the gate 8 and the substrate 2. Then, the silicon layer 30 is patterned by lithography technologies to define the floating gate. Certainly, the polysilicon layer 30 includes n+ type conductive dopants in the case. FIG. 10 shows the resulting scheme after the step. The floating gate consists of the gate 8, the polysilicon side wall spacers 28 and the polysilicon layer 30.

Figure 11:
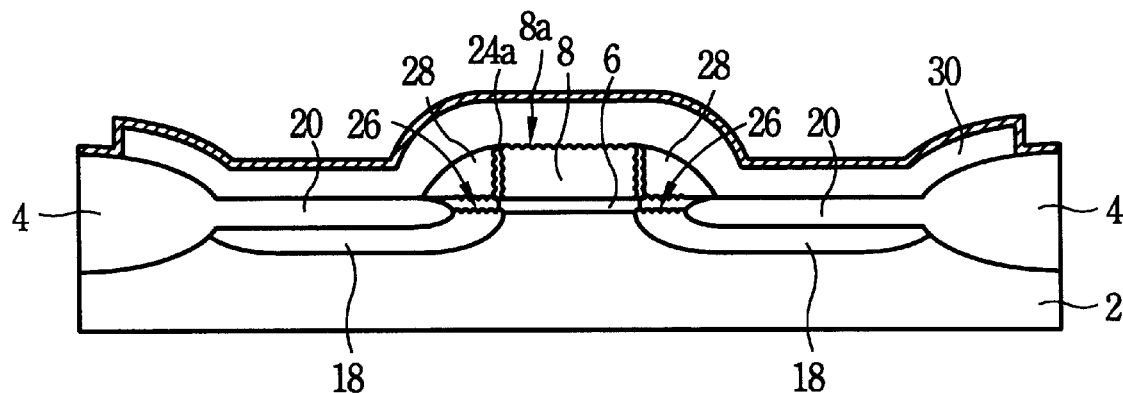
FIG. 11 is a cross-sectional view of a semiconductor wafer illustrating the step of forming a dielectric layer on the floating gate according to the present invention.
Figure 12:
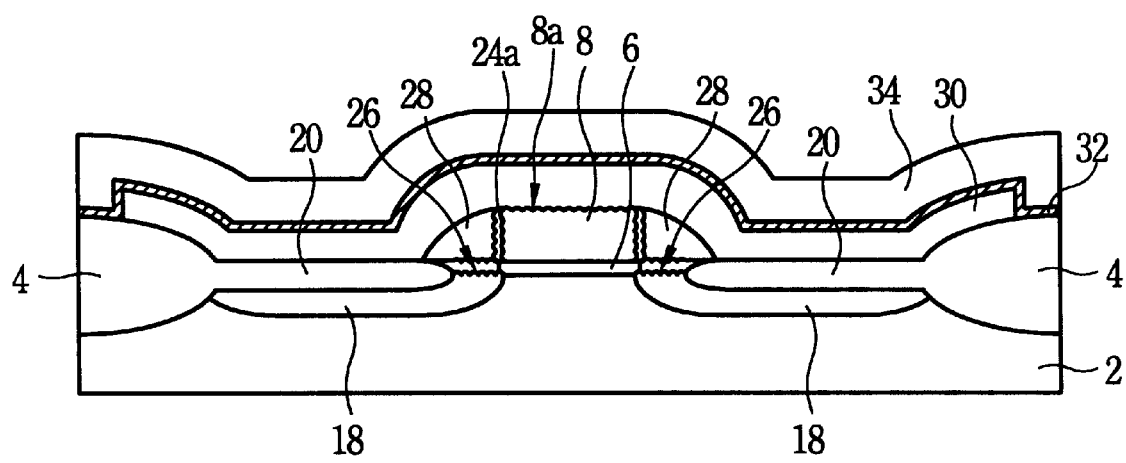
FIG. 12 is a cross-sectional view of a semiconductor wafer illustrating the step of forming a control gate according to the present invention.

Referring to FIG. 11, an inter polysilicon dielectric (IPD) 32 is formed at the top of the floating gate for isolation. ONO or NO is used as the IPD 32. Finally, as can be seen by reference to FIG. 12, a conductive layer, such as doped polysilicon layer 34, is formed on the IPD 32 as control gate. The doped polysilicon layer 34 can be chosen from doped polysilicon or in-situ doped polysilicon. In this case, the type of the dopants can be n+ conductive type. In addition, the metal or alloy layer can be used as the conductive layer.

As will be understood by persons skilled in the art, the foregoing preferred embodiment of the present invention is illustrative of the present invention rather than limiting of the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:

forming a gate dielectric layer on said semiconductor substrate;

forming a first polysilicon layer on said gate dielectric layer;

forming a silicon nitride layer on said first polysilicon layer;

patterning said silicon nitride layer, said first polysilicon layer and said gate dielectric layer to form a gate structure on said semiconductor substrate;

performed a first thermal oxidation to form a first oxide layer on said semiconductor substrate exposed by said gate structure and simultaneously form a polyoxide on side walls of said gate structure;

forming isolating spacers on side walls of said gate structure;

performing an ion implantation to form source and drain of said nonvolatile memory in said semiconductor substrate;

performing a second thermal oxidation to form a second oxide layer on said semiconductor substrate exposed by said gate structure and said isolating spacers, wherein the dopants of said first ion implantation being driven into said semiconductor substrate;

removing said silicon nitride layer, said isolating spacers, then removing said polyoxide layer and said gate oxide that is uncovered by said gate structure;

forming undoped silicon layer or hemispherical grained silicon along a surface of said gate structure and said second oxide layer;

performing a third thermal oxidation to convert said undoped silicon layer or said hemispherical grained silicon into a third oxide layer having textured interface between said semiconductor substrate and said third oxide layer;

removing said third oxide layer, wherein said gate structure has a rugged surface after said third oxide layer is removed;

forming a fourth oxide layer on said gate structure and on said substrate;

forming a second polysilicon layer on said fourth oxide layer;

anisotropically etching said second polysilicon layer, thereby forming polysilicon side wall spacers on said side walls of said gate structure, said fourth oxide layer at top of said gate structure and uncovered by said polysilicon side wall spacers being removed, said fourth oxide layer remaining under said polysilicon side wall spacers being used as a tunneling oxide;

forming a third polysilicon layer on said gate structure, said polysilicon side wall spacers;

patterning said third polysilicon layer to define a floating gate region, said first polysilicon layer, said polysilicon side wall spacers and said third polysilicon layer to being used as a floating gate;

forming an inter poly dielectric layer on said floating gate; and forming a fourth polysilicon layer on said inter poly dielectric layer, wherein said fourth polysilicon layer is used as a control gate.

2. The method of claim 1, wherein said gate dielectric is composed of silicon oxide.

3. The method of claim 1, wherein said gate dielectric is composed of JVD nitride, wherein said JVD nitride is referred to a silicon nitride formed by using jet vapor deposition.

4. The method of claim 1, wherein said isolating spacers are composed of silicon nitride.

5. The method of claim 1, wherein said first thermal oxidation is performed in $N_2O$ ambient.

6. The method of claim 1, wherein said first thermal oxidation is performed in NO ambient.

7. The method of claim 1, wherein said first thermal oxidation is performed in $N_2$ and $O_2$ ambient.

8. The method of claim 1, wherein said first thermal oxidation is performed at a temperature about 700 to 1150 degrees centigrade.

9. The method of claim 1, wherein said isolating spacers are removed by using hot phosphorus acid solution.

10. The method of claim 1, wherein said silicon nitride layer is removed by using hot phosphorus acid solution.

11. The method of claim 1, wherein said polyoxide layer is removed by using HF solution or BOE solution.

12. The method of claim 1, wherein said gate oxide is removed by using HF solution or BOE solution.

13. The method of claim 1, wherein said third thermal oxidation comprises dry oxidation.

14. The method of claim 13, wherein said third thermal oxidation is performed in $O_2$ ambient.

15. The method of claim 13, wherein said third thermal oxidation is performed at a temperature about 700 to 1000 degrees centigrade.

16. The method of claim 1, wherein said undoped silicon layer comprises amorphous silicon.

17. The method of claim 16, wherein said amorphous silicon is formed at a temperature about 400 to 600 degrees centigrade.

18. The method of claim 16, wherein said amorphous silicon is formed in an ambient containing $SiH_4/N_2$.

19. The method of claim 16, wherein said amorphous silicon is formed to have a thickness about 20 to 100 angstroms.

* * * * *